United States Patent
Wang

(10) Patent No.: US 12,061,124 B2
(45) Date of Patent: Aug. 13, 2024

(54) CIRCUIT TO COMPENSATE FOR TEMPERATURE IMPEDANCE DRIFT OF CONDUCTIVE COMPONENT

(71) Applicant: ADVANCED MICRO DEVICES (SHANGHAI) CO., LTD., Shanghai (CN)

(72) Inventor: Lin Wang, Shanghai (CN)

(73) Assignee: ADVANCED MICRO DEVICES (SHANGHAI) CO., LTD., Shanghai (CN)

( * ) Notice: Subject to any disclaimer, the term of this patent is extended or adjusted under 35 U.S.C. 154(b) by 456 days.

(21) Appl. No.: 17/126,326

(22) Filed: Dec. 18, 2020

(65) Prior Publication Data

US 2022/0196487 A1 Jun. 23, 2022

(51) Int. Cl.
| | |
|---|---|
| *G01K 7/22* | (2006.01) |
| *H01C 7/00* | (2006.01) |
| *H05K 1/02* | (2006.01) |
| *H05K 1/09* | (2006.01) |
| *H05K 7/06* | (2006.01) |

(52) U.S. Cl.
CPC ............ *G01K 7/22* (2013.01); *H01C 7/008* (2013.01); *H05K 1/0254* (2013.01); *H05K 1/09* (2013.01); *H05K 7/06* (2013.01)

(58) Field of Classification Search
CPC ........ G01K 7/22; H01C 7/008; H05K 1/0254; H05K 1/09; H05K 7/06; H05K 2201/10196
USPC ........................................................ 361/106
See application file for complete search history.

(56) References Cited

U.S. PATENT DOCUMENTS

| | | | | |
|---|---|---|---|---|
| 11,002,772 | B2 * | 5/2021 | Trichy | G01R 1/203 |
| 2012/0032612 | A1 * | 2/2012 | Antony | H05B 45/56 |
| | | | | 315/297 |
| 2014/0125301 | A1 * | 5/2014 | Handford | G05F 1/468 |
| | | | | 323/281 |
| 2018/0335455 | A1 * | 11/2018 | Xiang | G01R 31/2801 |

FOREIGN PATENT DOCUMENTS

| | | | |
|---|---|---|---|
| JP | 2002260744 A | * | 9/2002 |
| KR | 20060086869 A | * | 6/2006 |
| KR | 20060086869 A | * | 8/2006 |

OTHER PUBLICATIONS

C. W. Lai, S. Ziegler and H. H. C. Iu, "High gain amplification of low-side current sensing shunt resistor," 2008 Australasian Universities Power Engineering Conference, Sydney, NSW, Australia, 2008, pp. 1-5 (Year: 2008).*

* cited by examiner

*Primary Examiner* — Thienvu V Tran
*Assistant Examiner* — Sreeya Sreevatsa

(57) ABSTRACT

A current control module is employed to protect a conductive feature of a printed circuit board (PCB) from an overcurrent event by comparing a reference voltage output from a compensation circuit connected to a reference power supply to a voltage output from a conductive feature connected to a power supply which is different from the reference power supply. The reference output voltage is representative of an anticipated voltage output from the conductive feature. The current control module is configured to initiate regulation of power to the conductive feature when the voltage output from the conductive feature exceeds the reference voltage output.

20 Claims, 6 Drawing Sheets

CIRCUIT TO COMPENSATE FOR TEMPERATURE IMPEDANCE DRIFT OF CONDUCTIVE COMPONENT

BACKGROUND

Printed circuit boards (PCBs) are employed in a variety of electronic devices, such as computers, mobile communication devices, and appliances. The PCB includes components and conductive features contained within a mechanical structure. Conductive features of the PCB include traces, pads, heat sinks, conductive planes, and power rails that support electronic components mounted on the PCB. The conductive features of the PCB provide electrical signals to the various electronic components.

The electronic components are typically designed to support the electronic signaling within a specified range of currents. However, the physical conditions of the PCB, such as the ambient temperature and internal operating temperature, can impact the behavior of the conductive features, such that the electrical signals can, under some conditions, fall outside of the specified range of currents for a particular component or set of components. For example, under some conditions, the electrical signaling can experience large fluctuations, such as an inrush of current when a component is powered up or a steep drop in current when a given component performs an operation requiring a large amount of circuit activity. If left unmitigated, large fluctuations in current can damage the power supply of a device and components connected thereto.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
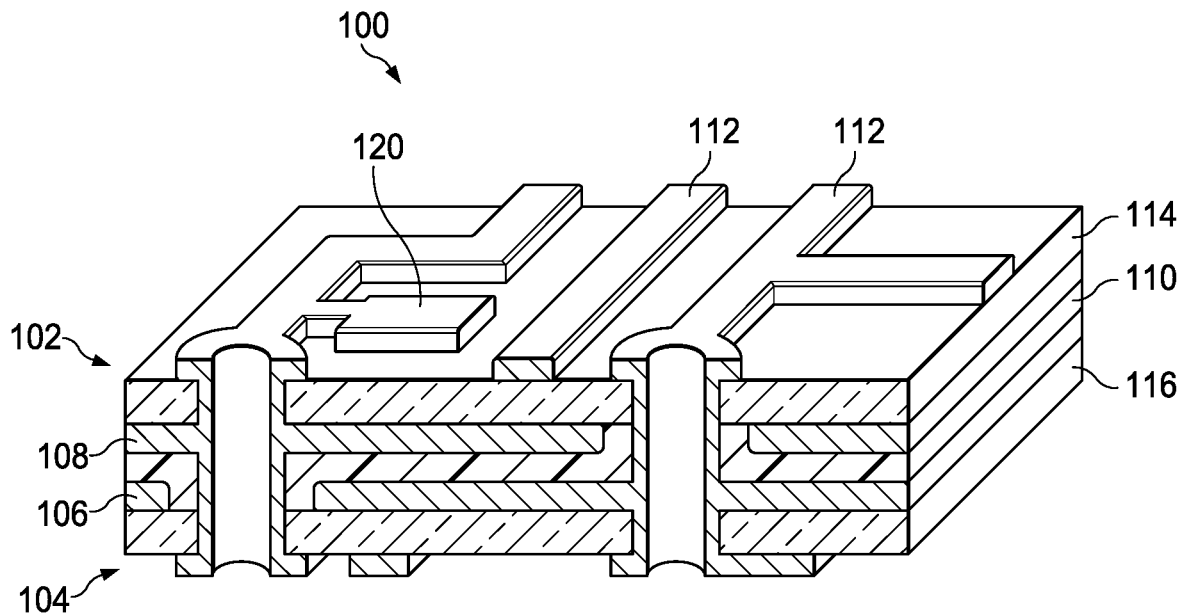
FIG. 1 is a cross-section of layers of an example PCB including a compensation circuit in accordance with some embodiments.

A PCB typically includes a control circuit to regulate the current of electrical signals provided via one or more conductive features of the PCB. For precise regulation of current within the conductive features of the PCB, it is desirable to support accurate measuring of the current at the one or more conductive features at a given point in time. Measurement of current within a circuit is sometimes performed by indirect sensing of the magnetic field generated by the flow of current through a given component. This non-invasive method is inherently isolated from the load (e.g., the electronic component to which the current is supplied), but requires specialized sensors that are influenced by temperature and proximity to magnetic fields other than that produced by the component of interest. Alternatively, direct sensing of a current often involves a shunt resistor placed in series with the load and either the power supply or ground. The shunt resistor is used to directly sense current because the current flowing through the shunt resistor is directly proportional to the ratio of the value of the voltage applied to the resistor. However, the use of a shunt resistor is an invasive technique that contributes to undesirable power dissipation in the system.

In some cases, the intrinsic resistance of a conducting element is used as a sensing element instead of a shunt resistor to directly sense current in a circuit. This approach is low cost and space-saving because no additional sensor or resistor is required, which also eliminates power losses that would otherwise occur with the use of a shunt resistor. However, the intrinsic resistance of the conducting element often varies based on environmental conditions such as temperature. For example, due to its high electrical conductivity, copper is a commonly used conducting material for the conductive features in PCBs. However, the resistance of copper increases at a linear rate based on copper's temperature coefficient (approximately 0.00393) as the temperature of the copper increases in a phenomenon known as thermal drift. The thermal drift of copper in a PCB alters the current measurement by the sensing element, such that this method of current sensing is problematic for applications that require accuracy in measuring current, such as peak current control applications where accurate detection of overcurrent is needed to prevent unsafe conditions for the components of the PCB. Relying on the resistance of a conducting element to measure current is also problematic because, as current is conducted through components of a device, heat is necessarily generated causing the temperature of the components to fluctuate resulting in changes to the resistance of conducting components in the device. These changes in resistance affect the accuracy of measuring the current conducted by a component.

FIGS. 1-7 illustrate systems and methods to compensate for the thermal drift of a conductive feature of a PCB in a peak current control application to determine if the current of the conductive feature has exceeded a threshold for safe operation and to initiate regulation of the power supplied to the conductive feature or to shut down power to the conductive feature altogether. Negative temperature coefficient (NTC) thermistors, whose output voltage increases with temperature at a linear rate similar to the temperature coefficient of the copper forming the conductive feature, are used to account for the thermal drift of the copper by outputting a voltage representative of the current of the conductive feature at a given temperature, thus providing an accurate and cost effective manner of detecting an overcurrent event at the conductive feature.

In some embodiments, a current control module is used to determine whether a conductive feature, such as a power plane of a PCB, is experiencing an overcurrent event by comparing a voltage from an amplifier connected to the conductive feature and a voltage from a compensation circuit. The compensation circuit includes at least two NTC thermistors connected to a reference power supply. The thermistors output a voltage to be used as a reference voltage at a comparator associated with a peak current control unit. The second input to the comparator is provided by an amplifier connected to a conductive feature of the PCB, such as a power plane. The amplifier outputs an amplified voltage for the power plane to the comparator to be compared to the reference voltage provided by the compensation circuit. Because voltage is directly proportional to current, the voltage outputs from both the conductive feature and the compensation circuit are representative of the current being conducted by each of the two components. The output from the amplifier is compared to the output from the compensation circuit and, if the voltage from the amplifier is determined to be higher than that of the compensation circuit, indicating that the conductive feature is experiencing higher current, the current control module initiates actions to regulate or shut down power to the conductive feature.

FIG. 1 illustrates a cross-section of the layers of an example PCB 100 in accordance with at least one embodiment. The PCB 100 depicted is a 4-layer PCB, meaning that it has four conductive layers, but in other embodiments, the PCB 100 includes any number of conductive layers depending on design and usage considerations. The PCB 100 includes a first routing layer 102 (or top layer) and a second routing layer 104 (or bottom layer) composed of traces 112 formed from a conductive material, most commonly copper. The traces 112 form conductive connections between components of the PCB 100. The PCB 100 also includes a power plane 106 and a ground plane 108 which are also formed from a conductive material, such as copper, and are connected to a power supply potential and to certain of the traces 112 of the first and second routing layers 102, 104 by vias 118. If some components of the PCB 100 require different voltages, in some embodiments individual power rails (not shown) are used in place of the power plane 106, and each rail is configured to provide a different voltage to different circuits on the PCB 100, whereas a power plane provides a single voltage to the connected components.

Between the ground plane 108 and power plane 106 is a dielectric layer 110 composed of fiberglass impregnated with resin, also known as a prepreg layer. Between the first routing layer 102 and the ground plane 108 is a dielectric core layer 114 composed of a glass-reinforced epoxy laminate material, such as FR4. A second core layer 116 is provided between the second routing layer 104 and the power plane 106. In different embodiments, the PCB 100 includes a number of other layers to protect the routing layers and facilitate the bonding of layers during the manufacturing process. For example, in some embodiments, the PCB 100 includes an overlay layer, a solder mask layer, and a solder paste layer (not shown). Further, though FIG. 1 illustrates a relatively small section of a PCB 100, in other embodiments many traces, components, and circuits are mounted on, incorporated with, or attached to, the PCB 100. For example, in the depicted example a compensation circuit 120 is included on the PCB 100 to provide a reference voltage for use by a comparator associated with a current control module located on the PCB 100 or elsewhere within a system containing the PCB 100, as further described below.

For purposes of the example of FIG. 1, it is assumed that the conductive layers and features of the PCB 100 are formed from copper. However, it will be appreciated that in other embodiments the conductive layers and features are formed from a different material or materials. An inherent characteristic of the material used to form the conductive layers and features of a PCB, including the power plane 106, ground plane 108, and the traces 112 of the first and second routing layers 102,104, is that the resistivity of the material increases as temperature increases. The relationship between temperature increase and resistivity increase is approximately linear and is modeled using the linear equation:

$$R(T)=R(T_0)*[1+\alpha(T-T_0)]$$

where R is the resistivity of the material at temperature T, α is the temperature coefficient of the material, and $R(T_0)$ is the resistivity at temperature $T_0$, usually $T_0=20°$ C. The temperature coefficient for copper is α=0.00393. Accordingly, the resistivity of a copper component of a PCB can increase by up to 39.3% over a temperature range from 0° C. to 100° C. As peak current control for a power supply of a PCB relies on an accurate current measurement, this is too large of a variation in resistivity to be useful in measuring current for peak current control applications as normal operating temperatures for many electrical devices fall within the range of 0° C. to 100° C. and fluctuations within this range are quite common. Instead of directly measuring the current of a conductive feature of a PCB, in some embodiments, the voltage of the conductive features are monitored and used in a peak current control application to represent current being conducted by the component experiencing thermal drift, as described further with respect to FIG. 2.

Figure 2:
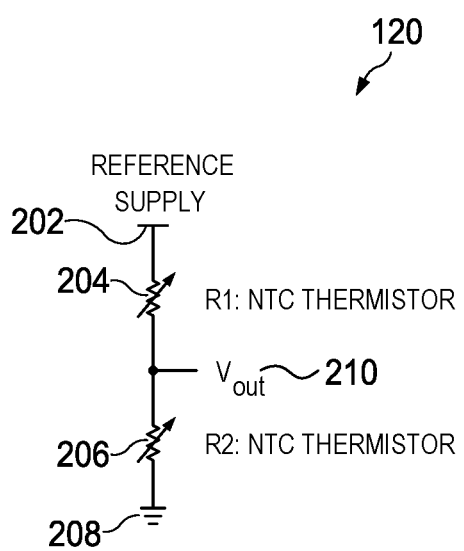
FIG. 2 illustrates a compensation circuit including a pair of thermistors to monitor the voltage of a reference power supply in a PCB in accordance with some embodiments.

FIG. 2 illustrates the compensation circuit 120 in accordance with some embodiments. The compensation circuit 120 includes a pair of thermistors 204 and 206 to provide a voltage measurement of a reference power supply in order to detect an overcurrent event in a conductive feature in a PCB, such as the power plane 106 of the PCB 100 illustrated in FIG. 1, in accordance with at least one embodiment. In other embodiments, the conductive feature is a power rail or trace formed from copper. Within the compensation circuit 120, a first thermistor 204 is connected to an adjustable reference power supply 202. The amount of current provided by the reference power supply 202 is adjusted based on a maximum desired current threshold for the conductive feature of the PCB 100. The first thermistor 204 is connected in series with a second thermistor 206, which is connected to a ground reference 208. The combination of the first and second thermistors 204, 206 generates an output voltage 210 ($V_{out}$) to be provided to a comparator associated with a current control module of the PCB, such as the comparator 623 and current control module 630 described below with reference to FIG. 6.

In some embodiments, the first thermistor 204 and second thermistor 206 are NTC thermistors. NTC thermistors have thermal and electrical properties that are a function of the geometry of the thermistor, the particular metal oxides from which the thermistor is made, and the additional materials (e.g., electrodes, solders, lead wires, etc.) that are applied to the thermistor. In the compensation circuit 120, the first and second thermistors 204, 206 have thermal and electrical properties that produce output voltage 210 with a linear rate of change over a temperature range of 0° C. to 105° C. that approximates the observed voltage output of a copper foil feature over the same temperature range, as shown in FIGS. 3 and 4.

For example, in some embodiments the first thermistor 204 has a resistance of 150$k\Omega$, a B-constant of 4500K, a maximum operating current of 0.026 mA, a maximum voltage of 5V, a dissipation constant of 1 mW/° C., and an operating temperature range of −40° C. to 125° C. Additionally, in some embodiments, the second thermistor 206 has a resistance of 47 kΩ, a B-constant of 4050K, a maximum operating current of 0.046 mA, a maximum voltage of 5V, a dissipation constant of 1 mW/° C., and an operating temperature range of −40° C. to 125° C. The thermal and electrical properties of the first and second thermistors 204, 206 are provided as examples and not intended to limit the disclosure as in other embodiments any combination of thermistors that produces a linear rate of change for output voltage 210, over a specified temperature range, that approximates the voltage output of the material used in the conductive feature over the same temperature range are used in the compensation circuit 120.

Figure 3:
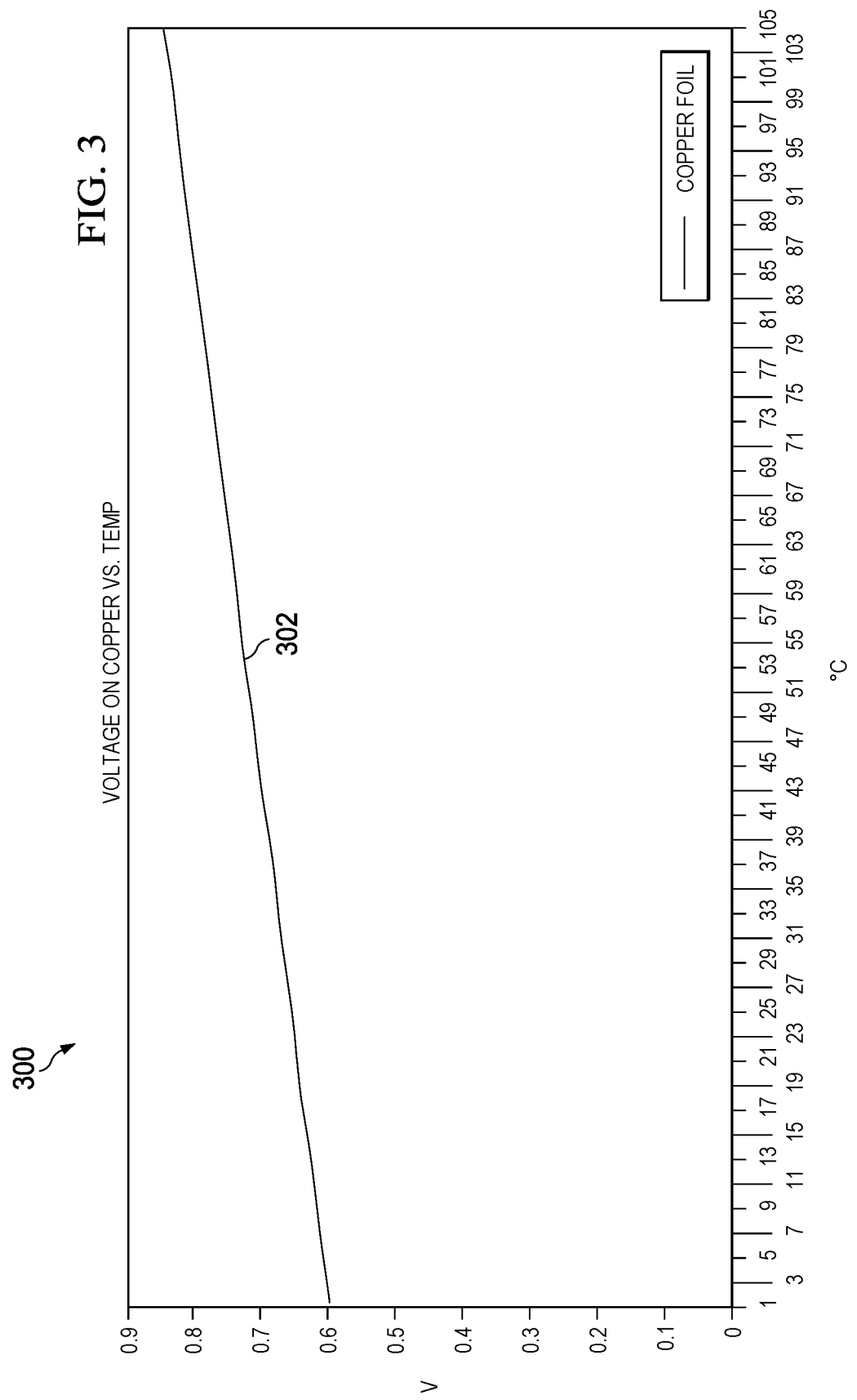
FIG. 3 illustrates a graph of voltage output from an amplifier associated with a power plane, such as that illustrated in FIG. 1, as temperature increases from 0° C. to 105° C. in accordance with some embodiments.

FIG. 3 illustrates a graph 300 of the measured voltage (V) 302 of a conductive feature made of copper foil, such as the power plane 106 illustrated in FIG. 1, as the temperature increases from 0° C. to 105° C. in accordance with some embodiments. Temperature in ° C. is represented on the x-axis and voltage is represented on the y-axis of the graph 300. Voltage values are based on a current of 100 A provided through a section of copper foil with 6 mohm at temperatures from 0° C. to 105° C. Thus, because voltage is proportional to resistance per Ohm's law, in a system such as that used to measure the voltage 302 of the conductive feature, where the current is maintained at a constant value, the voltage increases at a predictable rate as the resistivity of the conductive feature increases with increased temperature.

Figure 4:
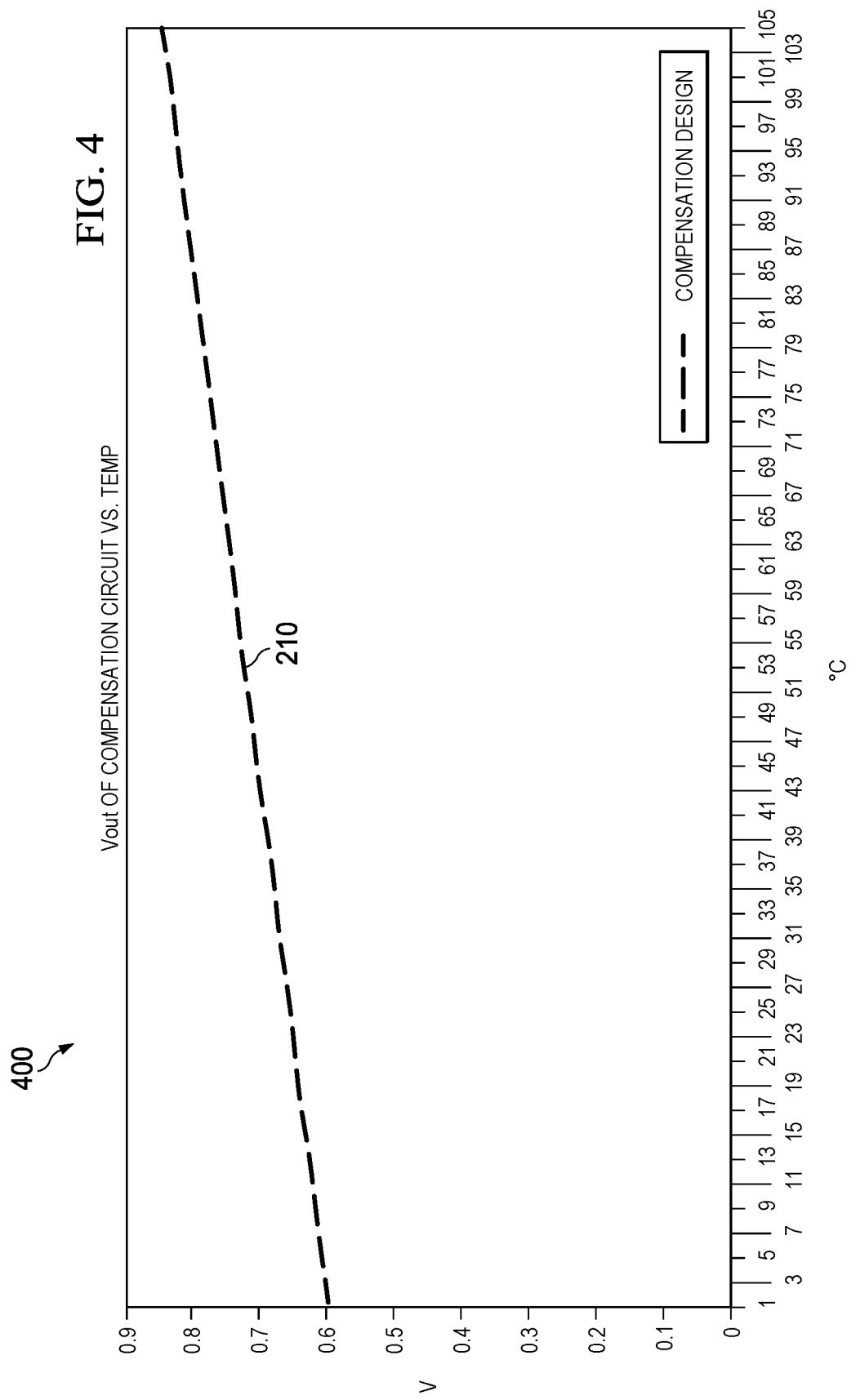
FIG. 4 illustrates a graph of the voltage output of the compensation circuit illustrated in FIG. 2 as the temperature increases from 0° C. to 105° C. in accordance with some embodiments.

FIG. 4 illustrates a graph 400 of $V_{out}$ 210 of the compensation circuit 200 illustrated in FIG. 2 as the temperature increases from 0° C. to 105° C. Temperature in ° C. is represented on the x-axis and voltage is represented on the y-axis. The current provided by the reference power supply 202 is set so that $V_{out}$ 210 is equal to 0.6V at 0° C. Thus, in the depicted example, the linear rate of change of $V_{out}$ 210 is substantially similar to the observed rate of change for the voltage output 302 of the conductive feature as shown in FIG. 3. Therefore, the combination of the first thermistor 204 and second thermistor 206 provides an inexpensive way to generate a voltage output that is representative of a current being conducted by a conductive feature of the PCB 100 over a range of operating temperatures and in some embodiments is used in place of directly measuring current in the conductive feature.

Figure 5:
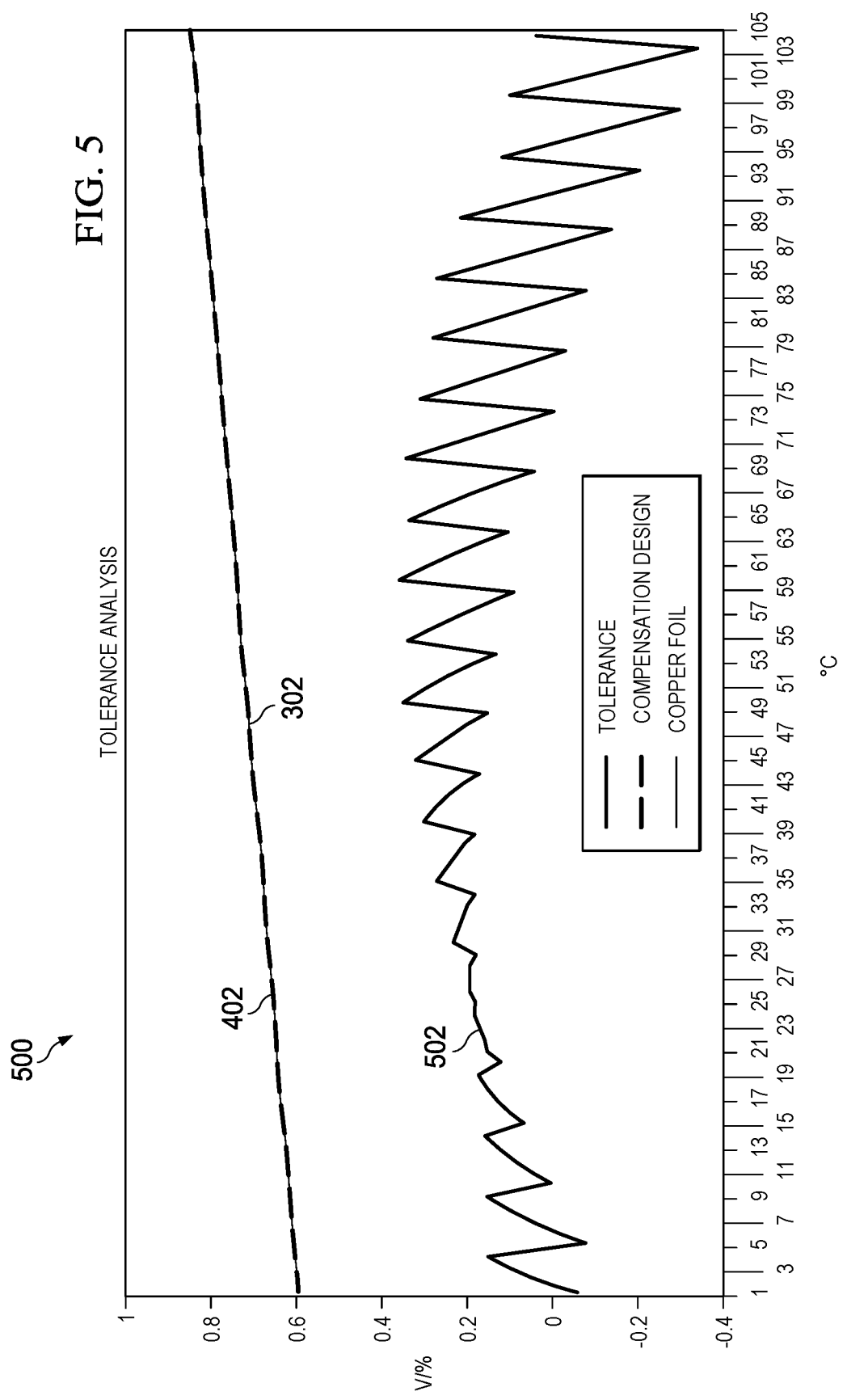
FIG. 5 illustrates a graph of a statistical tolerance for the voltage output of the compensation current of FIG. 2 compared to the measured voltage output of the amplifier associated with the power plane illustrated in FIG. 3 in accordance with some embodiments.

Based on a statistical analysis of the variation between $V_{out}$ 402 and the measured voltage 302 using the formula $(V_{out}-V)/V*100\%$, the tolerance 502 of $V_{out}$ is within 0.4% of the measured voltage 302 of the conductive feature over a temperature range of 0° C. to 105° C., as shown in the tolerance graph 500 of FIG. 5. Temperature in ° C. is represented on the x-axis, while voltage and percentage are represented on the y-axis. Thus, the compensation circuit 200 provides a relatively accurate representation of the voltage of a conductive feature to be used in determining whether the current being conducted by the conductive feature exceeds a threshold in order to initiate mitigation measures to prevent damage to the conductive feature and components connected thereto when high current is detected.

Figure 6:
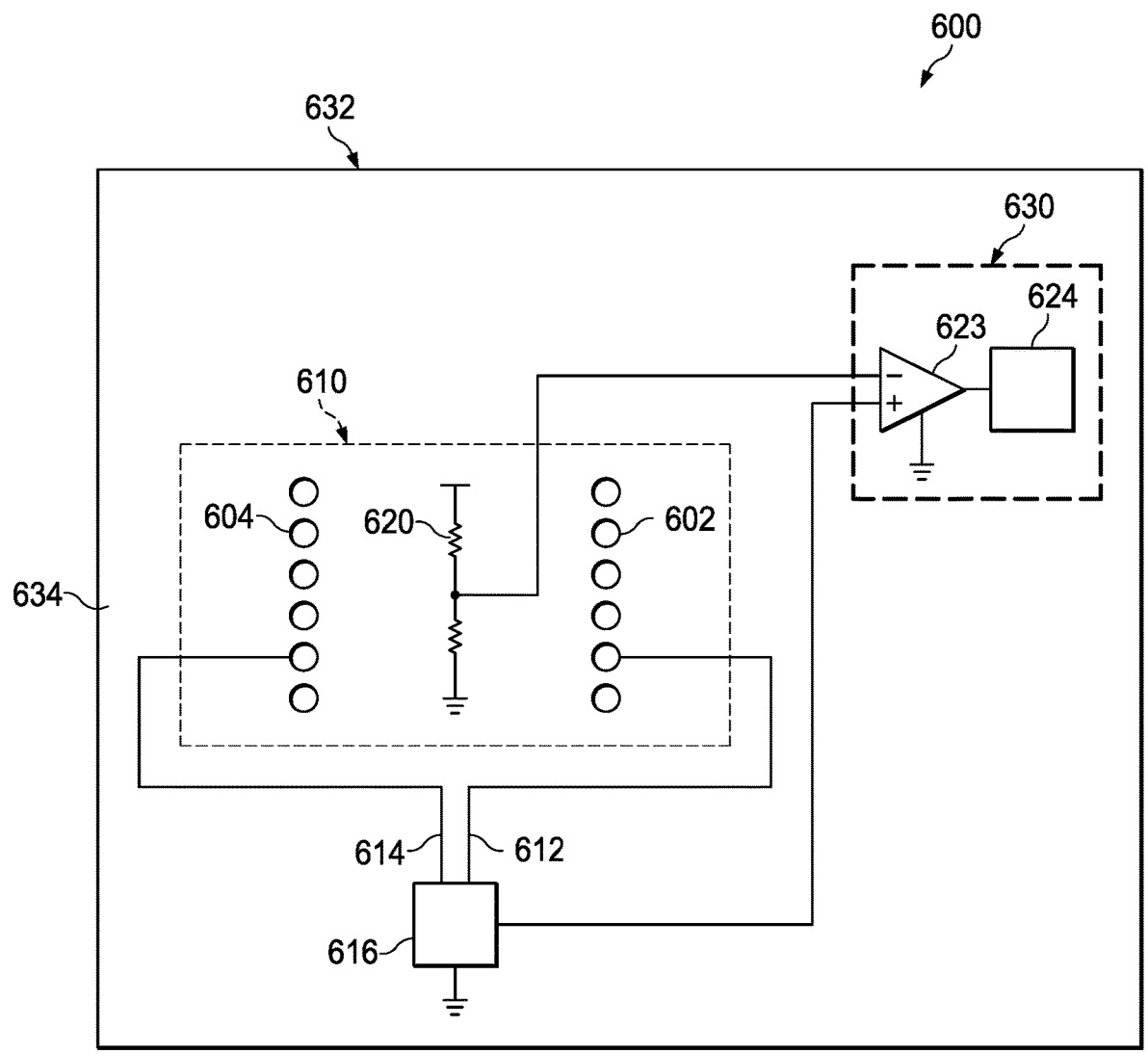
FIG. 6 is a top view block diagram of a current control system including a compensation circuit, such as the compensation circuit illustrated in FIG. 2, in accordance with some embodiments.

FIG. 6 illustrates a block diagram of a current control system 600 of a PCB 632 including a current control module 630 connected to a compensation circuit 620 in accordance with at least one embodiment. In some embodiments, the compensation circuit 620 is configured similarly to the compensation circuit 120 illustrated in FIG. 2. The current control system 600 includes a conductive feature 610 disposed within an inner layer of the PCB 632. In different embodiments, the conductive feature is a power plane, power rail, or trace, and the like, and is formed from, or includes, copper, such as the power plane 106 and traces 112 illustrated in FIG. 1. The conductive feature 610 is connected to a first trace 614 by a first via 604 and an amplifier 616 is connected to the first via 604 by the first trace 614. A second via 602 connects the conductive feature 610 to a second trace 612, which connects the second via 602 to the amplifier 616. The amplifier 616 is configured to amplify the voltage measured at the conductive feature 610, as measured between the first and second vias 604, 602, by a factor of ten, though in other embodiments a different factor is applied by the amplifier based on the magnitude of the output values from the compensation circuit 620. The amplifier 616 is connected to a comparator 623 of a current control module 630 and is configured to provide the amplified voltage of the conductive feature 610 to the comparator 623.

The compensation circuit 620 is located on a surface 634 of the PCB 632, in vertical alignment with the center of the conductive feature 610 disposed at an inner layer of the PCB 632 to ensure that the compensation circuit 620 will experience similar temperature changes to those experienced by the conductive feature 610. The compensation circuit 620 provides an output voltage ($V_{out}$) to the comparator 623 associated with the current control module 630. The comparator 623 is configured to compare the amplified voltage of the conductive feature with $V_{out}$ received from the compensation circuit 620 and provide the result to the peak current controller 624 of the current control module 630. If the amplified voltage from the conductive feature 610 is greater than $V_{out}$, this is an indication that the conductive feature 610 is conducting a larger current than the preset current provided by the reference power supply to the compensation circuit 620 as the resistance of the conductive feature 610 and the compensation circuit 620 are approximately equal. When the amplified voltage from the conductive feature 610 is greater than $V_{out}$, the peak current controller 624 is configured to signal to a power source controller (not shown) to regulate or shut down power to the conductive feature 610 in order to prevent damage to the conductive feature 610 and other components connected thereto.

Figure 7:
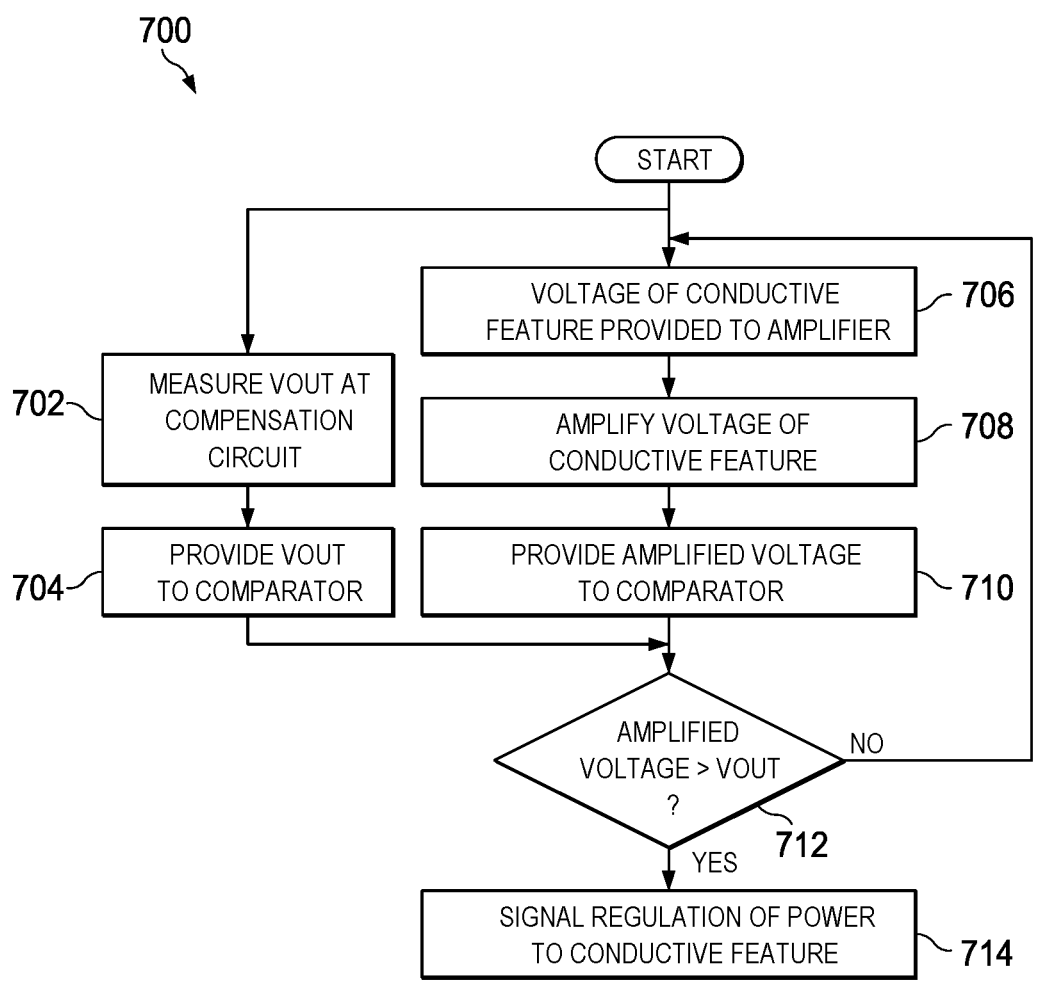
FIG. 7 is a flow diagram illustrating a method for current control for a power supply of a PCB utilizing a compensation circuit in accordance with some embodiments.

FIG. 7 illustrates a method 700 of peak current control for a conductive feature of a PCB utilizing a current control system, such as the current control system 600 illustrated in FIG. 6 in accordance with at least one embodiment. At block 702, the voltage of the reference power supply $V_{out}$ is measured at the compensation circuit 620. The $V_{out}$ is output from the compensation circuit and received at the comparator 623 of the current control module 630, at block 704. Concurrent with the measurement of $V_{out}$, the voltage of the conductive feature 610 is provided to the amplifier 621, at block 706. At block 708, the voltage of the conductive feature 610 is amplified by a factor at the amplifier 621. The amplified voltage is provided at block 710 to the comparator 623. At block 712, the amplified voltage is compared with $V_{out}$ and, if the amplified voltage is greater than $V_{out}$, a signal indicating power regulation of the conductive feature is to be initiated, as shown at block 714. If the amplified voltage is less than or equal to $V_{out}$, it is an indication that the current being conducted by the conductive feature 610 is within an acceptable range, and regulation of the power supplied to the conductive feature 610 is not needed. Thus, monitoring the voltage of both the compensation circuit 620 and the conductive feature 610 continues.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A system comprising:
    a compensation circuit coupled to a reference power supply and configured to generate a reference voltage output that is representative of a voltage output from a conductive feature connected to a power supply different from the reference power supply;
    an amplifier configured to generate a first voltage output based on a detected voltage at the conductive feature; and
    a current control circuitry configured to compare the reference voltage output to the first voltage output and to initiate regulation of power to the conductive feature when the first voltage output exceeds the reference voltage output.

2. The system of claim 1, wherein the conductive feature is one of a printed circuit board (PCB) power rail, a PCB trace, or a PCB power plane.

3. The system of claim 1, wherein the compensation circuit comprises:
    a first thermistor connected to the reference power supply; and
    a second thermistor connected to the first thermistor and a ground.

4. The system of claim 3, wherein the first thermistor and the second thermistor are negative temperature coefficient (NTC) thermistors.

5. The system of claim 1, wherein the conductive feature is formed from copper.

6. The system of claim 1, wherein the reference voltage output and first voltage output increase with increased temperature.

7. The system of claim 6, wherein the reference voltage output increases at a linear rate equal to the linear rate of a temperature coefficient of a conductive material forming the conductive feature.

8. A printed circuit board (PCB) comprising:
    a pair of thermistors having a resistivity that changes at a rate based on a temperature coefficient of a conductive material forming a conductive feature of the PCB, the pair of thermistors being configured to generate a first output voltage based on the resistivity; and
    a current control circuit configured to:
        receive the first output voltage from the pair of thermistors and a second output voltage from an amplifier coupled to the conductive feature,
        compare the first output voltage to the second output voltage, and
        initiate regulation of power supplied to the conductive feature in response to the second output voltage being greater than the first output voltage.

9. The PCB of claim 8, wherein the conductive feature is one of a power rail, a trace, or a power plane.

10. The PCB of claim 8, wherein the pair of thermistors is a pair of negative temperature coefficient (NTC) thermistors.

11. The PCB of claim 8, wherein the conductive feature is formed from copper.

12. The PCB of claim 8, wherein the first output voltage and second output voltage increase with increased temperature.

13. The PCB of claim 8, wherein the pair of thermistors is disposed at a first layer of the PCB and the conductive feature is disposed at a second layer of the PCB.

14. The PCB of claim 13, wherein the second layer of the PCB is an inner layer of the PCB.

15. A method comprising:
    monitoring a first voltage output from an amplifier coupled to a conductive feature, formed of a conductive material, of a printed circuit board (PCB) at a current control circuitry;
    monitoring a second voltage output from a compensation circuit of the PCB at the current control circuitry, the second voltage output being representative of a change in resistivity of the conductive material over a temperature range;
    comparing the first voltage output to the second voltage output at a comparator of the current control circuitry; and
    initiating regulation of power supplied to the conductive feature in response to the first voltage output being greater than the second voltage output.

16. The method of claim 15, wherein the conductive feature is one of a PCB power rail, a PCB trace, or a PCB power plane.

17. The method of claim 15, wherein the compensation circuit comprises:
    a first thermistor connected to a reference power supply; and
    a second thermistor connected the first thermistor and a ground.

18. The method of claim 17, wherein the first thermistor and the second thermistor are negative temperature coefficient (NTC) thermistors.

19. The method of claim 15, wherein the first voltage output from the conductive feature and the second voltage output from the compensation circuit increase with increased temperature.

20. The method of claim 19, wherein the first voltage output from the conductive feature increases at a linear rate equal to the linear rate of a temperature coefficient of the conductive material.

* * * * *